United States Patent
Bismuth

(10) Patent No.: US 11,187,746 B2
(45) Date of Patent: Nov. 30, 2021

(54) CONTACT QUALITY TESTING

(71) Applicant: Nuvoton Technology Corporation, Hsin-chu (TW)

(72) Inventor: Alain Bismuth, Kibbutz Beth Rimon (IL)

(73) Assignee: NUVOTON TECHNOLOGY CORPORATION, Hsin-Chu (TW)

(*) Notice: Subject to any disclaimer, the term of this patent is extended or adjusted under 35 U.S.C. 154(b) by 117 days.

(21) Appl. No.: 16/364,243

(22) Filed: Mar. 26, 2019

(65) Prior Publication Data
US 2020/0309850 A1 Oct. 1, 2020

(51) Int. Cl.
*G01R 31/28* (2006.01)

(52) U.S. Cl.
CPC ..... *G01R 31/2891* (2013.01); *G01R 31/2834* (2013.01); *G01R 31/2853* (2013.01)

(58) Field of Classification Search
CPC ............ G01R 31/2891; G01R 31/2834; G01R 31/2853; G01R 31/2855; G01R 31/2886; G01R 31/2863; G01R 31/2879; G01R 31/2893
USPC ..................................................... 324/750.01
See application file for complete search history.

(56) References Cited

U.S. PATENT DOCUMENTS

| | | | | |
|---|---|---|---|---|
| 6,262,580 B1* | 7/2001 | Wu | ...................... | G01R 27/205 324/538 |
| 7,029,932 B1* | 4/2006 | Hiser | ................... | G01R 27/205 438/14 |
| 2002/0093359 A1* | 7/2002 | Babcock | .......... | G01R 31/31926 324/762.02 |
| 2009/0134905 A1* | 5/2009 | Long | ................... | G01R 31/2853 324/763.01 |
| 2009/0251165 A1* | 10/2009 | Ni | ....................... | G01R 31/2853 324/750.26 |
| 2013/0038340 A1* | 2/2013 | Masuda | .................. | G01R 27/14 324/713 |
| 2014/0253162 A1* | 9/2014 | Wang | .................. | G01R 31/2889 324/754.08 |

OTHER PUBLICATIONS

Liguori et al., "Automatic Test Equipment," Wiley 15 Encyclopedia of Electrical and Electronics Engineering, pp. 110-120, year 1999.

* cited by examiner

*Primary Examiner* — Melissa J Koval
*Assistant Examiner* — Courtney G McDonnough
(74) *Attorney, Agent, or Firm* — Kligler & Associates Patent Attorneys Ltd

(57) ABSTRACT

An apparatus for automatic testing of an electronic device includes a pad interface unit and measurement circuitry. The pad interface unit is configured to connect to pads of the electronic device. The measurement circuitry is configured to select a circuit path in the electronic device that passes via a digital signal pad from among the pads, which is configured to carry a digital signal, to estimate a non-binary measure indicative of an electrical resistance of the circuit path, by performing current-voltage measurements using the pad interface unit, and to determine, based on the non-binary measure, whether the digital signal pad passes or fails a test.

12 Claims, 4 Drawing Sheets

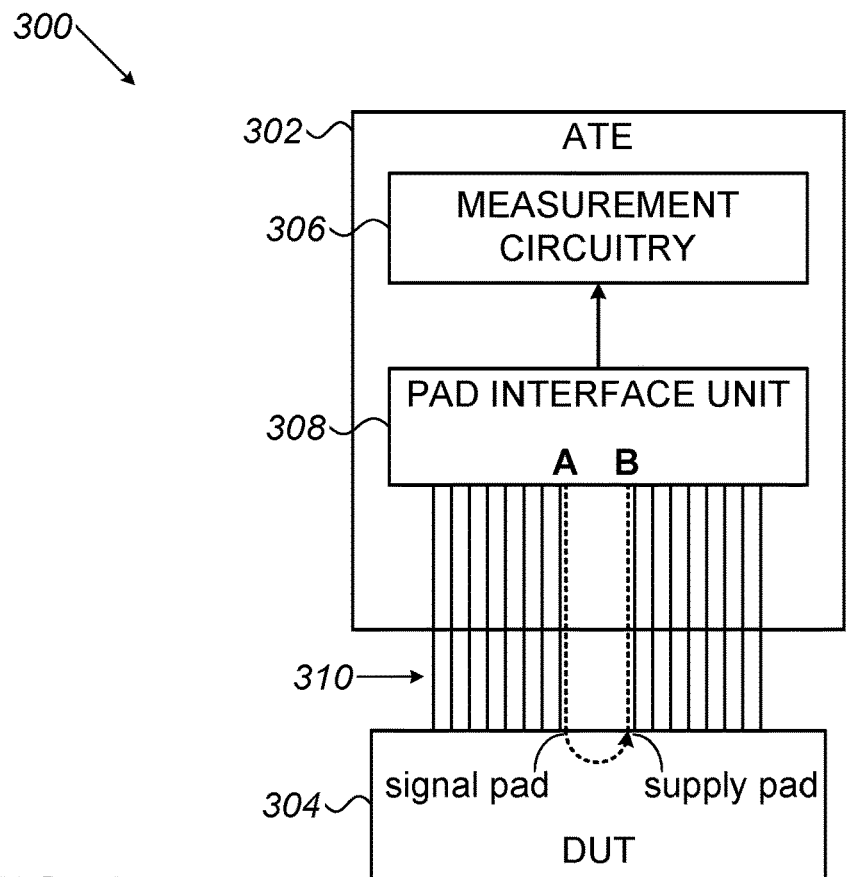
FIG. 3
FIG. 4
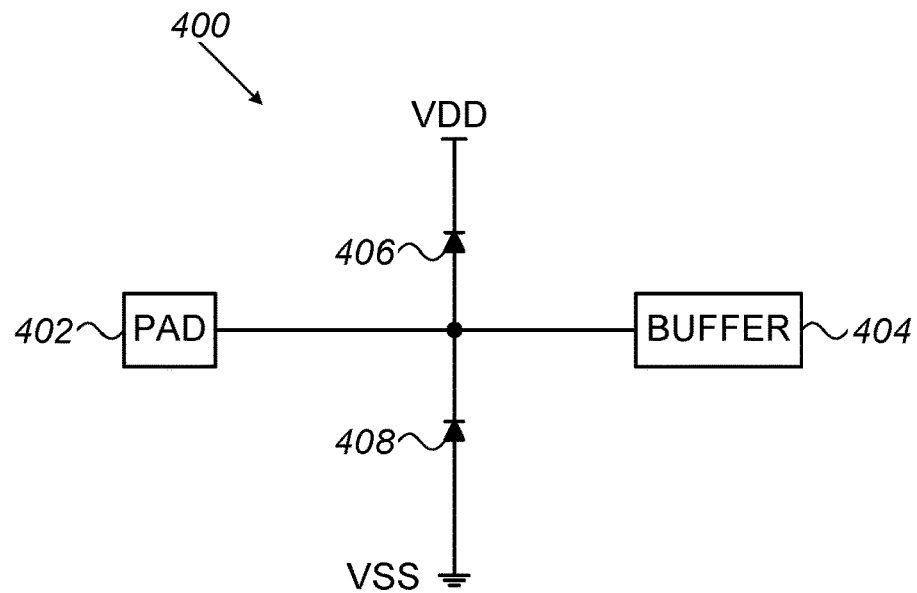

CONTACT QUALITY TESTING

FIELD OF THE INVENTION

The present invention relates generally to automated test equipment, and particularly to connectivity tests in automatic test equipment.

BACKGROUND OF THE INVENTION

Automatic test equipment (ATE) performs tests on a device, (will be referred to hereinbelow as Device Under Test, or DUT). When the DUT is an electronic component, such as an integrated circuit (IC), the ATE typically applies voltage and current patterns to the DUT inputs, and measures voltages and currents at the DUT outputs.

A summary of ATE technology, including hardware and software, can be found in "Automatic Test Equipment," Wiley Encyclopedia of Electrical and Electronics Engineering, 1999, by F. Liguori, pages 110-120.

SUMMARY OF THE INVENTION

An embodiment that is described herein provides an apparatus for automatic testing of an electronic device. The apparatus includes a pad interface unit and measurement circuitry. The pad interface unit is configured to connect to pads of the electronic device. The measurement circuitry is configured to select a circuit path in the electronic device that passes via a digital signal pad from among the pads, which is configured to carry a digital signal, to estimate a non-binary measure indicative of an electrical resistance of the circuit path, by performing current-voltage measurements using the pad interface unit, and to determine, based on the non-binary measure, whether the digital signal pad passes or fails a test.

In some embodiments, the circuit path runs between the digital signal pad and a power-supply pad of the electronic device. In an embodiment, the circuit path includes an Electro-Static Discharge (ESD) protection diode of the electronic device, and the measurement circuitry is configured to perform the current-voltage measurements over at least the ESD-protection diode.

In another embodiment, in performing the current-voltage measurements, the measurement circuitry is configured to apply two or more different current-voltage operating points to the digital signal pad. In yet another embodiment, in response to determining that the digital signal pad passed the test, the measurement circuitry is configured to apply an additional test to the electronic device.

There is additionally provided, in accordance with an embodiment of the present invention, a method for automatic testing of an electronic device. The method includes selecting a circuit path in the electronic device that passes via a digital signal pad of the electronic device, which is configured to carry a digital signal. A non-binary measure, indicative of an electrical resistance of the circuit path, is estimated by performing current-voltage measurements. A determination is made, based on the non-binary measure, whether the digital signal pad passes or fails a test.

BRIEF DESCRIPTION OF THE DRAWINGS

FIG. 3 is a block diagram that schematically illustrates the structure of an ATE, in accordance with embodiments of the present invention;

FIG. 4 is a diagram that schematically illustrates an Electro-Static Discharge (ESD) protection circuit in an integrated circuit, in accordance with an embodiment of the present invention;

DETAILED DESCRIPTION OF EMBODIMENTS

Overview

Figure 1:
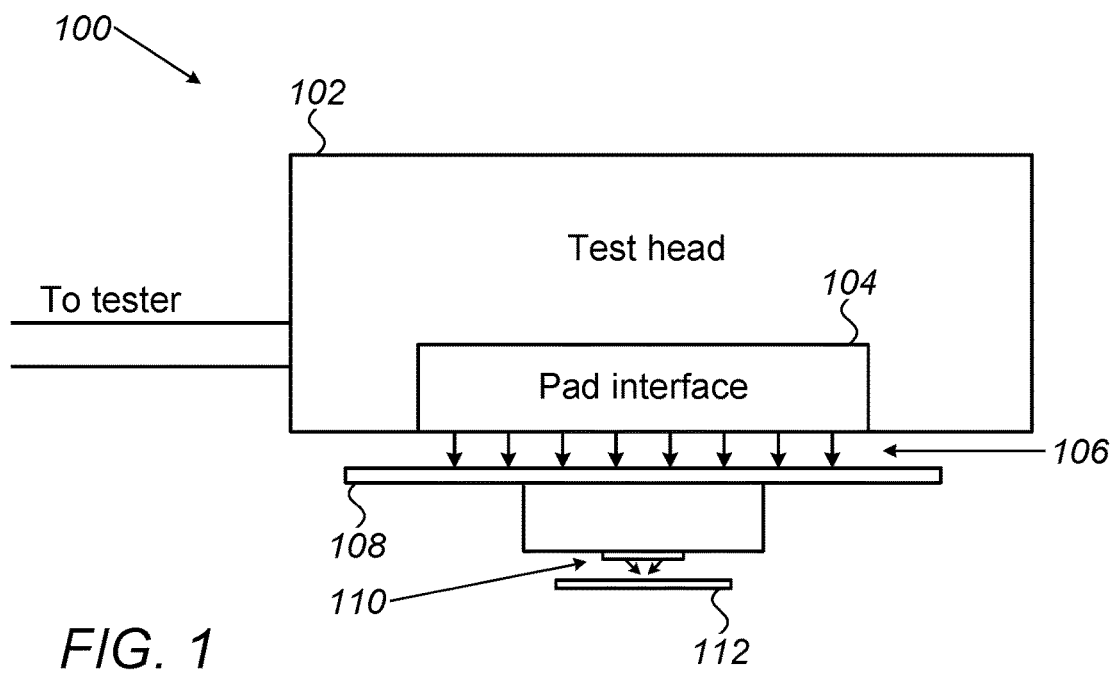
FIG. 1 is a block diagram that schematically illustrates the mechanical interface between an Automatic Test Equipment (ATE) and silicon wafers, in a wafer-sort setup, in accordance with embodiments of the present invention.

Automatic Test Equipment (ATE) for integrated circuits typically comprises a measurement unit, and an electrical/mechanical interface that is connected to the pins of the Device-Under-Test (DUT). In some embodiments according to the present invention, the electrical/mechanical interface, which will be referred to as "pad interface" hereinbelow, comprises POGO pins, that connect to the DUT through a Load-Board (that may comprise load components such as resistors and capacitors), and either a Probe-Card (for the testing of semiconductor wafers, "wafer-sort"), or a socket, such as a Zero-Insertion-Force (ZIF) socket (for the testing of packaged integrated circuits; "assembly test"). Embodiments of the present invention, however, are not limited to the mechanical interface described above; rather, in embodiments of the present invention, any form of mechanical connection between the pad interface of the ATE and the DUT pads can be used.

In some embodiments according to the present invention, the ATE may test a plurality of DUTs, for example, to sort integrated-circuit dies in a silicon wafer, or, in another example, to perform final testing of assembled semiconductor devices. In some embodiments, devices that do not pass the test are marked as defective ("bad"). In other embodiments, the test comprises sorting the devices that are not defective according to electrical performance, to bins such as Fast, Normal and Slow.

In some embodiments, the ATE tests a large number of devices (for example, in wafer-sorting done at a silicon fabrication facility, hundreds or thousands of integrated-circuit dies may fit on each silicon wafer, and many wafers must be daily tested). To test each DUT, the Pad Interface Unit of the ATE is mechanically connected to the pads of the DUT, forming an electrical low-resistance contact between the pads of the DUT and the ATE (typically through additional units, such as load boards and probe cards).

In practice, e.g., due to test setup problems, occasionally some of the DUT pads may not connect properly to the pad interface. Connection problems may occur, for example, if the probe card is not parallel to the wafer, or if the mechanical feeder fails to insert a device in the socket. Embodiments of the present invention provide techniques for identifying and rectifying such problems.

In some embodiments, when the ATE tests a DUT, the ATE begins the test with verifying that all the DUT pads are connected to the pad ATE (this test will be referred to as "connectivity test" hereinunder). If the connectivity test fails, an operator may be alerted, to rectify the problem, and then the test may be rerun. If the connectivity test passes, the ATE proceeds to run functionality tests (including timing), and other tests. One purpose of the connectivity test is to avoid rejection of good DUTs due to poor test setup.

As the connectivity test checks that the pads of the DUT are connected to the ATE, it may be tempting to do a simple loose-margin connectivity test (e.g., because loose margin tests run faster). For example, in typical integrated-circuit devices, each digital signal pad is coupled to the positive and negative supply pads by an electro-static discharge (ESD) protection diodes. The ATE may force a current (e.g., 100 micro-amp) in a path that starts at the pad-interface signal pad, runs through the DUT digital-signal pad, an ESD-protection diode (in a Forward direction) and the DUT power pad, and ends at the pad-interface power pad. The ATE will then measure the voltage between the power pad and the digital-signal pad (in the pad interface unit). If, for example, the forward voltage across the diode at a current of 100 micro-amp is 0.7V±10%, then a measured voltage of more than 1.5V clearly indicates that the path is open.

However, such a simple test will not detect cases wherein the path is not open but the contact resistance is poor (e.g., 100 ohm). Such cases may occur, for example, if a needle of the probe-card is contaminated. The DUT may fail, in the example above, at later tests such as functionality tests, as an additional 100-ohm resistance may significantly degrade the timing performance of the digital-signal pad.

In embodiments according to the present invention that are provided herein, the ATE applies a connectivity test to a digital-signal pad, i.e., to a pad that carries a digital signal. The digital-signal pad may comprise an input pad or an output pad (or an input-output pad). The connectivity test comprises measuring of the contact resistance (for example, by examining a plurality of current-voltage (I-V) points in a circuit path that comprises the contact and the forward resistance of an ESD protection diode, which is typically small enough to allow accurate estimation of the contact resistance). The ATE typically alerts an operator if the measured resistance exceeds the expected resistance by a tight margin (and, after the operator rectifies the problem, typically repeats the test). Thus, failures that are caused by contacts that are not open and yet exhibit high resistance values, as a result of poor test setup, can be fixed, and rejection of good DUTs due to poor test setup may be significantly decreased.

System Description

FIG. 1 is a block diagram that schematically illustrates a mechanical interface 100 between an Automatic Test Equipment (ATE) and silicon wafers, in a wafer-sort setup, in accordance with embodiments of the present invention.

A Test Head 102 extends from the ATE, and comprises a Pad Interface unit 104, which comprises POGO pins 106 that extend from the Test Head.

A Load Board 108 (which typically comprises load resistors and capacitors that may be needed for the testing), comprises pads on one side (top side in the example configuration of FIG. 1) and a probe-card 110 on the other side (bottom side in FIG. 1); the pads of the load-board are wired to needles of the probe-card.

When a Wafer 112 is sorted, the test-head is pressed against the load board, so that the POGO pins establish electrical contact with the pads of the load board. When an integrated circuit in the wafer (a "die") or a group of dies is tested, the wafer is pressed against the load-board, so that pads of the dies (or group of dies) are electrically connected to the needles of the probe card, and, through pads of the load-board, to the POGO pins of the pad-interface.

Figure 2:
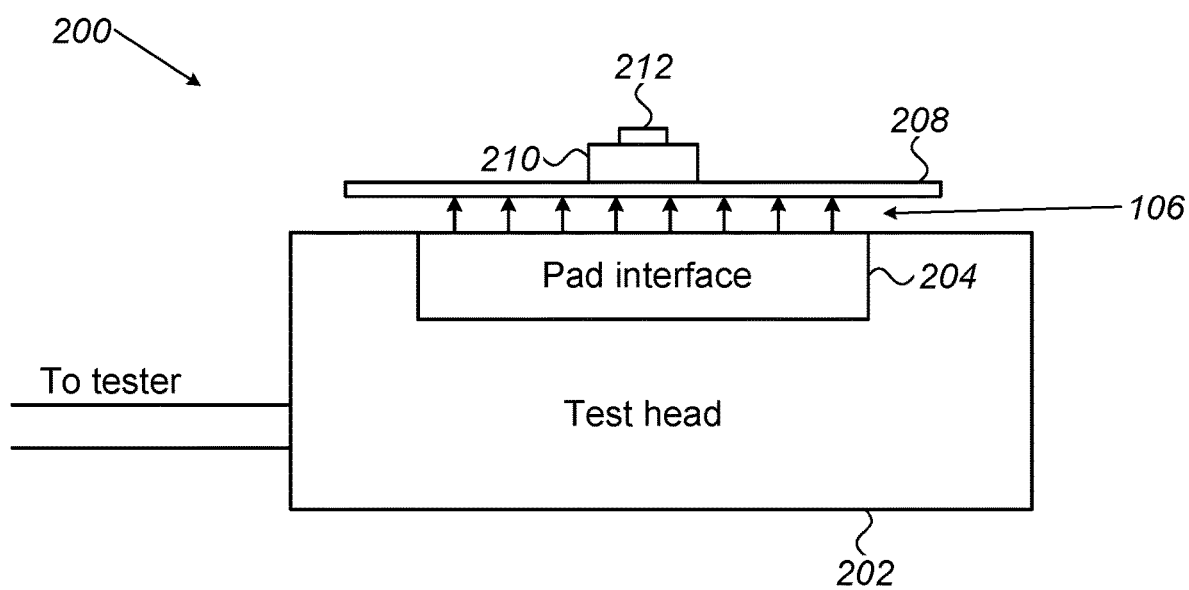
FIG. 2 is a block diagram that schematically illustrates the mechanical interface between an Automatic Test Equipment (ATE) and packaged integrated circuits, in an assembly-test setup, in accordance with embodiments of the present invention.

FIG. 2 is a block diagram that schematically illustrates a mechanical interface 200 between an Automatic Test Equipment (ATE) and a packaged integrated circuit, in an assembly-test setup, in accordance with embodiments of the present invention.

A Test Head 202 extends from the ATE, and comprises a Pad Interface unit 204, which comprises POGO pins 206 that extend from the Test Head. In some embodiments, Test Head 202 may be identical to the corresponding test head of FIG. 1; in other embodiments the test heads are different.

A Load Board 208 (which typically comprises load resistors and capacitors that may be needed for the testing), comprises pads on one side (bottom side in the example configuration of FIG. 2) and a socket 210 on the other side (top side in FIG. 2). A mechanical handler (not shown) inserts packaged integrated circuits into a socket prior to the test. After the test the mechanical handler extracts the integrated circuits from the socket, and typically adds the integrated circuit, respective to the test result, to a good-parts bin or to a rejected-parts-bin.

When assembly test is executed, the test-head is pressed against the load board, so that the POGO pins establish electrical contact with the pads of the load board. Thus, when the handler inserts an integrated circuit in the socket, the pads of the integrated circuit are electrically connected to the pad interface unit.

As would be appreciated, the wafer-sort setup and the assembly-test setup that are illustrated in FIGS. 1 and 2 are example embodiments that are cited by way of example. Test setups in accordance to the disclosed techniques are not limited to the description hereinabove. In alternative embodiments, for example, a load-board may be eliminated, and a probe card or a socket may be directly connected to the Pad Interface. In other embodiments, a similar setup may be used for the testing of integrated circuits that are mounted on a Printed Circuit Board (PCB).

As would be appreciated by those skilled in the art, in both the wafer sort setup and the assembly-test setup illustrated in FIGS. 1 and 2 and described above, any of the electrical connections that are mechanically established is prone to malfunction such as poor contact quality. In the wafer sort setup, the electrical connections comprise contacts between the POGO pins of the pad interface and the pads of the load-board, and contacts between the probe-card and the pads of dies on the wafer. In the assembly test setup, the electrical connections comprise contacts between the POGO pins of the pad interface and pads of the load-board, and contacts between the socket and the pads of the integrated circuit under test.

If any of the contacts is poor, the DUT may fail the test, reducing production yields and, thus, increasing the average price of the integrated circuits. If a probe card is misaligned, entire silicon wafers may be rejected, and if a pin of the socket is broken, an entire batch of integrated circuits may be rejected.

In embodiments according to the present invention, the ATE detects electrical connection failures in a connectivity test that is run at an early stage of the test and may alert the test operator to fix a mechanical problem and then rerun the test. Thus, the rejection of tested devices due to contact failures is significantly reduced. In an embodiment, the connectivity test comprises estimating a non-binary ("soft") measure indicative of the resistance from each of the digital-signal pads of the DUT to the supply pads of the DUT (as will be explained below, in embodiments of the present invention, the digital-signal pads of an integrated circuit are connected to the supply pads via diodes).

FIG. 3 is a block diagram 300 that schematically illustrates the structure of an ATE 302 according to embodiments of the present invention. The ATE is coupled to a DUT 304; and comprises a Measurement Circuitry 306, and a Pad Interface 308.

The Measurement Circuitry comprises the various circuits of the tester, including current and voltage sources, signal measurement, and control. In some embodiments the Measurement Circuitry comprises a computer.

The Pad Interface Unit comprises POGO pins 310 that can be connected (by applying mechanical pressure) to the DUT pads, typically via a load board and either a probe card or a socket (not shown).

Consider a digital-signal pad of the DUT, i.e., a pad that carries a digital signal such as a data signal or clock signal. To run a connectivity test of such a digital-signal pad of the DUT, Measurement Circuitry 306 applies, via Pad Interface Unit 308, known currents into POGO pin A, which is connected to the digital-signal pad of the DUT. The return path of the current is through POGO B, which is connected to a power pad of the DUT. The Measurement Unit then measures the voltage differences between POGOs A and B for the known currents and calculates the resistance of the path.

As would be appreciated, the structure of ATE 302 and the connections between ATE 302 and DUT 304 that are illustrated in FIG. 3 pertain to an example embodiment that is cited by way of example. ATEs (and the connection of the ATEs to the DUTs) in accordance with the disclosed techniques, are not limited to the description hereinabove. In alternative embodiments, for example, the ATE executes connectivity tests by forcing voltages onto a path and measuring the current, or by applying voltages through series resistors. In some embodiments, there may be a plurality of power pads, and the ATE may execute the connectivity test by shorting all or some of the power pads and measuring the resistance between the shorted power pads and the digital-signal pads. In an embodiment, the connectivity test may comprise separate resistance measurements from the digital-signal pad to separate power pads.

In embodiments according to the present invention, the digital-signal pads of DUTs are typically connected to the supply pads, through Electro-Static Discharge (ESD) protection diodes.

FIG. 4 is a diagram 400 that schematically illustrates an Electro-Static Discharge (ESD) protection circuit in an integrated circuit, in accordance with embodiments of the present invention. A digital Signal Pad 402 of the integrated circuit is coupled to a Buffer 404, which may be an input buffer, an output buffer, or an Input-Output buffer. The circuit comprises a diode 406, which is connected between the pad and the positive power supply (VDD), and protects the transistors of the integrated circuits from positive electrostatic charges that may be induced in the integrated circuit pad; and, a diode 408, which is connected between the pad and the negative power supply (VSS), and protects the integrated circuits from negative electrostatic charges.

As would be appreciated by those skilled in the art, the ESD protection circuit illustrated in FIG. 4 and described hereinabove is an example embodiment that is cited by way of example. ESD protection circuits used in alternative embodiments may vary—for example, in some embodiments ESD protection may comprise more than two diodes, and in some other embodiments, resistors may be added.

In some embodiments, there are no dedicated ESD protection circuits in digital-signal pads that are output (or input/output), as the transistors of the output buffer are, in effect, diodes that connect the pad to the power supplies. In the description hereinbelow we will not distinguish between diodes of a dedicated ESD protection circuit and diodes of an indirect protection circuit, that are formed by the output buffers of the integrated circuit.

Figure 5:
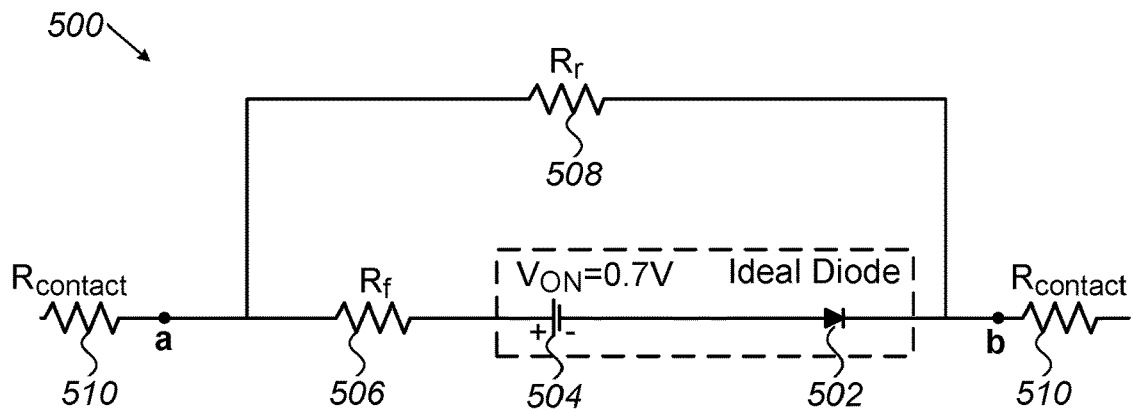
FIG. 5 is a circuit diagram that schematically illustrates the electrical model of a diode, in accordance with an embodiment of the present invention.

FIG. 5 is a circuit diagram 500 that schematically illustrates the electrical model of a diode, in accordance with an embodiment of the present invention. The model comprises an ideal diode 502 (with zero resistance in the forward direction and infinity in the reverse direction), a power source 504 that determines the threshold voltage for forward conduction by the diode, a forward-bias-resistor Rf (506), which models the internal resistance of the diode, and a reverse-bias resistor Rr (508), which models the leakage across the diode when the diode is reverse-biased (Rr is typically much larger than Rf).

The diode ports are marked a and b in FIG. 4. When the diode is connected to the ATE, two contact resistors 510 are added, which model the contact resistances of the signal pad and the power pad (or pads).

In embodiment according to the present invention, the resistance of the ESD protection diodes, with the contact resistances, is measured. As Rf is typically low (e.g., less than 10 ohm), small values of the contact resistors can be easily detected.

Figure 6:
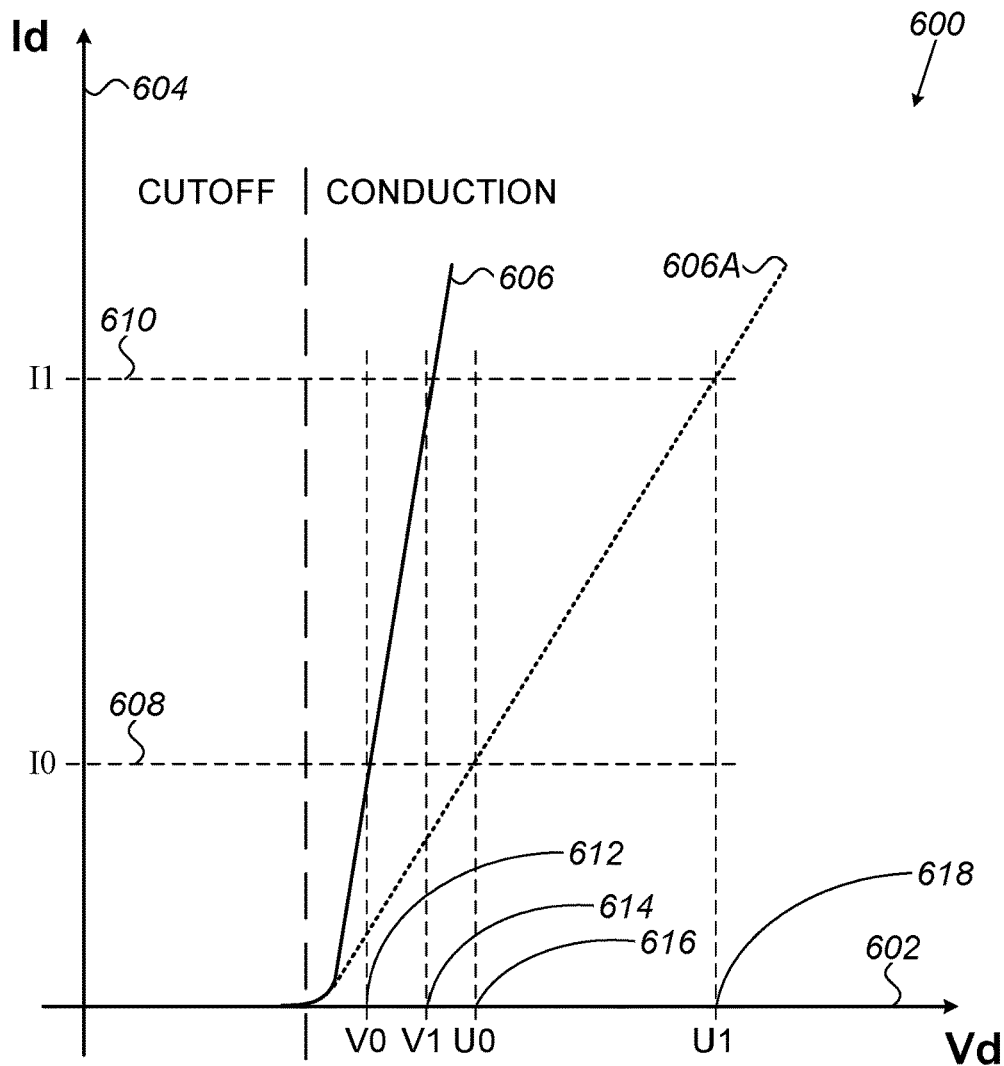
FIG. 6 is a diagram that schematically illustrates the I-V curve of a diode with serial contact resistances, according to an embodiment of the present invention.

FIG. 6 is a diagram 600 that schematically illustrates the I-V curve of a diode with serial contact resistances, according to an embodiment of the present invention. The I-V curve is observed by the ATE, and, hence, the diode models includes the resistances of the contacts.

A horizontal Vd axis 602 represents the voltage that the ATE measures across the ESD protection diode (that is— from the signal pad to the supply pad), and a vertical Id axis 604 represents the current through the diode. A solid graph 606 represents the observed I-V curve when the contacts are good, and a dashed graph 606A represents the I-V curve when one (or both) of the contacts is poor (e.g.—a probe-card needle is contaminated). As can be observed, the diode is in "cutoff" region, with leakage current only (through Rr of FIG. 4) when Vd is below a threshold (e.g. 0.7V), and in a linear "conduction" region when Vd is higher than the threshold.

To execute a connectivity test, the ATE measures the resistance of the path that comprises the contacts and an ESD-protection diode, and then compares the result to a threshold. According to the example embodiment of FIG. 6, to measure the resistance, Measurement Circuitry 306 (FIG. 3) drives currents into the diode, and measures the voltage between the digital-signal pad and the power pad, for two current levels—a current I0 (608), and a current I1 (610). The measured voltages for [I0, I1] are, respectively, [V0,V1] for graph 606, and [U0, U1] for graph 608.

According to embodiments of the present invention, the measurement circuitry may calculate the resistance when the diode is in the Conduction region by dividing the voltage difference V1−V0 (or U1−U0) by the current difference I1−I0. The result may vary between DUT types and within the pads of the DUT, but for the same DUT type and the same pad, the results are close to each other, as the same electric circuits in the DUT are tested. Thus, if resistance statistics of the pads of a DUT are collected, one may be able to define tight margins for the acceptable resistance values of each pad of the DUT.

As the measurement is differential, errors that stem from fixed bias of the measurement will be eliminated. For example, if the currents I0 and I1 that the measurement circuitry generates are shifted by a fixed bias:

I0'=I0+bias;
I1'=I1+bias;

then the subtraction operation I1'−I0'=I1−I0 cancels the bias error. Similarly, fixed biases in the measurements of V0, V1 will be eliminated when V1−V0 is calculated.

The differential measurement also cancels-out uncertainty in the value of the threshold voltage 504 of the diode (Von, see FIG. 5). Von may vary from pad to pad, but the variation is cancelled-out when V1−V0 is calculated.

As would be appreciated, the I-V curves and the measured I-V points that are illustrated in FIG. 6 are examples that are cited by way of example. The I-V points that are measured in accordance to the disclosed techniques are not limited to the description hereinabove. In alternative embodiments, for example, Measurement Circuitry 306 may measure more than two I-V points. The measurement circuitry may apply voltages rather than currents, or the measurement circuitry may apply combinations of voltage and currents. In an embodiment, Measurement Circuitry 306 may apply an AC current with a DC bias and measure the AC voltage.

Figure 7:
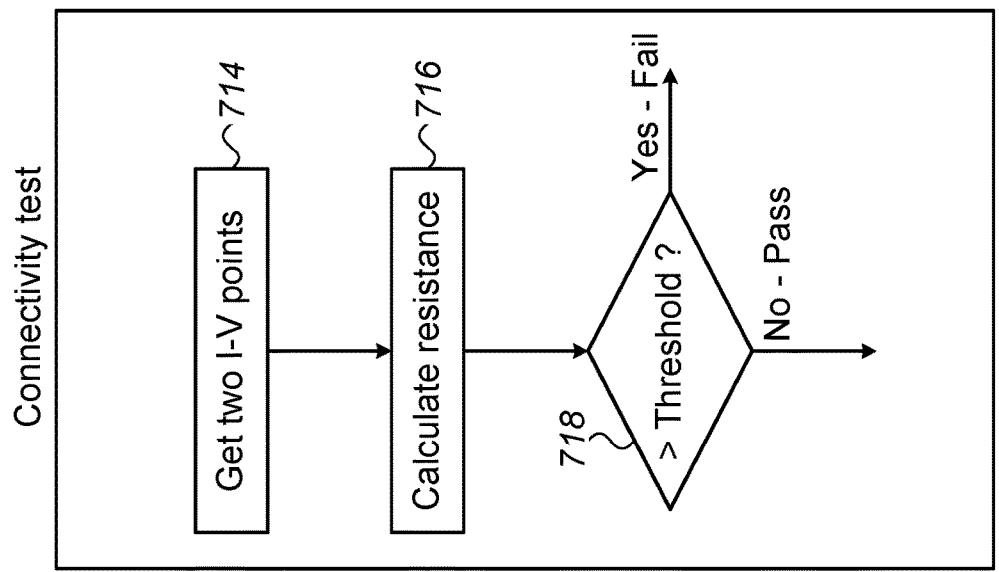
FIG. 7 is a flow chart that schematically illustrates a method for the testing of integrated circuits, according to an embodiment of the present invention.
Figure 7:
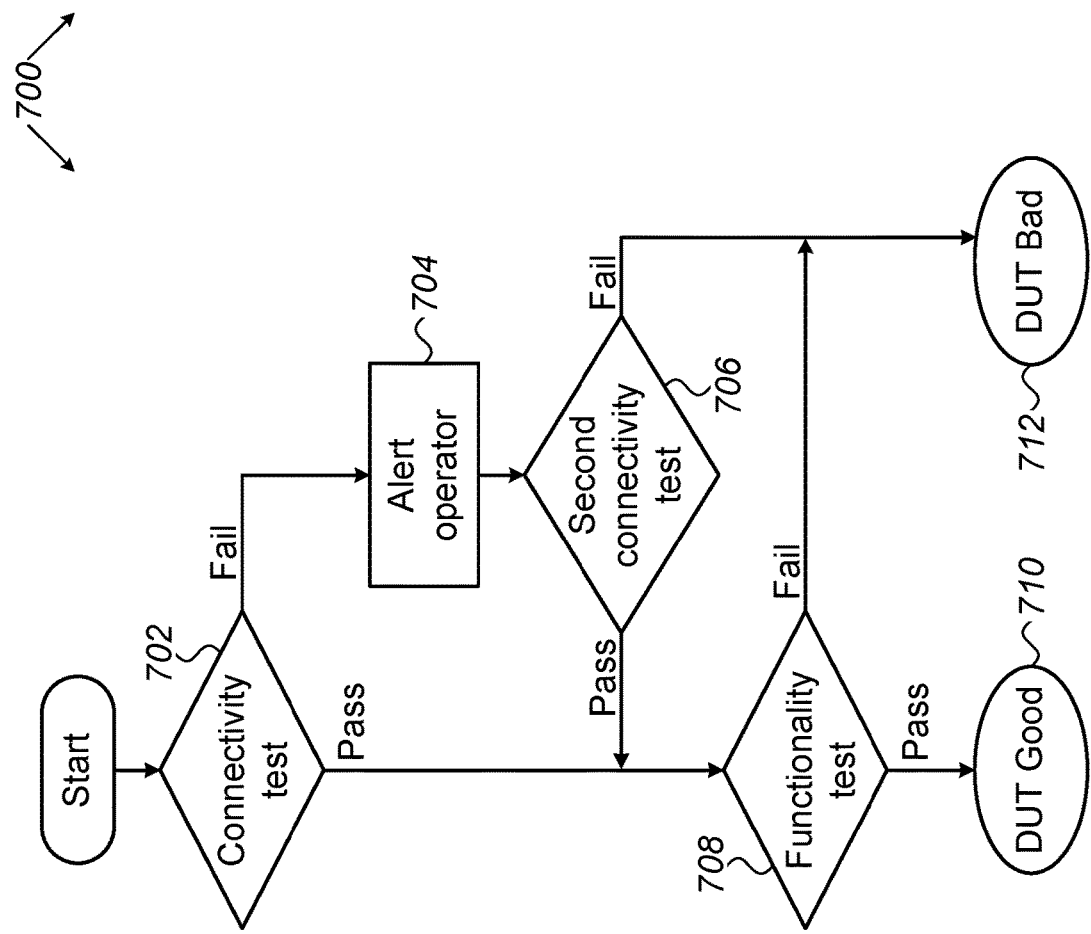

FIG. 7 is a flow chart 700 that schematically illustrates a method for the testing of integrated circuits, according to an embodiment of the present invention. The flow chart is executed by Measurement Circuitry 306 (and, as will be described below, by the ATE operator).

The flow starts at Connectivity-Testing step 702, wherein the ATE runs a connectivity test (the connectivity test comprises a non-binary estimate of the electrical resistance; to be detailed below). If, at step 702, the test fails, the measurement circuitry will enter an Alerting Operator step 704, wherein the measurement circuitry will alert a test operator that connectivity test has failed. The operator may then take steps to fix the problem (e.g. replace a load board) and signal the measurement circuitry to continue.

When indicated by the operator, the measurement circuitry will enter a Running Second Connectivity Test step 706 wherein the measurement circuitry repeats the connectivity test. If, at step 706, the connectivity test fails again, the measurement circuitry will enter a DUT-Bad step 712, wherein the DUT is deemed Bad (for example, the location of the die in the wafer is marked as Bad in a test data-base computer file).

If, in step 702 or in step 706, the DUT passes the connectivity test, the measurement circuitry will enter a Running Functionality Test step 708, wherein the measurement circuitry will perform other tests of the DUT (the functional tests may vary between DUT types and are beyond the scope of the present invention). If the DUT passes the functionality test of step 708, the measurement circuitry will enter a DUT Good step 710, wherein the DUT is deemed good. After either step 720 or step 712 the flow ends.

The details of the connectivity tests 702 and 706 are illustrated in the box at the right side of FIG. 7. As explained, the connectivity test comprises measuring the resistance of the diode in a digital-signal pad, and then taking a decision if the resistance is in spec by comparing the measured resistance to the expected resistance with a narrow margin.

At a Getting I-V points 714, the measurement circuitry forces two currents through the diode (I0 and I1 of FIG. 6) and measures the voltages across the diode. The measurement circuitry then enters a Calculating Resistance step 716, and calculates the resistance, for example, by dividing the difference between the two voltages by the difference between the two currents. Next, the measurement circuitry enters a Comparing Resistance to Threshold step 718, wherein the measurement circuitry checks if the resistance is greater than the expected resistance value (with a predefined margin that is relatively narrow), in which case the connectivity test fails. If the resistance is not higher than the expected resistance by more than the predefined margin, the connectivity test passes.

Thus, in embodiments according to the present invention, Measurement Circuitry 306 runs a connectivity test, wherein at least two I-V points are measured to obtain a non-binary measure of the resistance of the path that comprises an ESD protection diode of a digital-signal pad and contacts; the DUT fails the test if the value of the resistance is larger than the expected resistance by a narrow margin, and the cases where a DUT that is poorly connected fails at the functional test are considerably reduced.

As would be appreciated, the testing method that is illustrated in the flow-chart of FIG. 7 is an example embodiment that is cited by way of example. Testing methods in accordance to the disclosed techniques are not limited to the description hereinabove. In alternative embodiments, for example, the connectivity test may also indicate that a signal pad is shorted to one or to both supplies (and, in that case, the measurement circuitry will exit from step 702 directly to step 712, wherein the DUT fails the test). In another embodiments, more than two connectivity tests may be run if previous connectivity test fails. In yet other embodiments, there is no operator, and the measurement circuitry may, if a connectivity test fails, try to improve the connections (e.g.—by extracting and reinserting the DUT in the socket) automatically.

The structure of ATE 300, Measurement Circuitry 306, Pad Interface Units 308, the testing setups 100 and 200, ESD-protection structure 400, diode model 500, I-V curves 600 and method 700, illustrated in FIGS. 1 through 7 and described hereinabove, pertain to example embodiments. Embodiments according to the present invention are not limited to the descriptions above. Measurement Circuitry 306 may comprise FPGA, ASIC, or a combination of FPGA and ASIC; the functions of Measurement Circuitry 306 may be implemented by hardware, by software, or by combination of hardware and software. In some embodiments Measurement Circuitry 306 may comprise a general-purpose programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus for automatic testing of an electronic device, the apparatus comprising:
   a pad interface unit, configured to connect to pads of the electronic device; and
   measurement circuitry, configured to:
      select a single circuit path in the electronic device that passes via a digital signal pad from among the pads, which is configured to carry a digital signal;
      estimate a single non-binary measure indicative of an electrical resistance of the single circuit path, by performing current-voltage measurements using the pad interface unit; and
      distinguish, based solely on the electrical resistance of the single circuit path indicated by the single non-binary measure, between (i) test success, (ii) test failure due to a fault in the single circuit path, and (iii) test failure due to poor contact quality between the digital signal pad and the pad interface unit.

2. The apparatus according to claim 1, wherein the circuit path runs between the digital signal pad and a power-supply pad of the electronic device.

3. The apparatus according to claim 1, wherein the circuit path comprises an Electro-Static Discharge (ESD) protection diode of the electronic device, and wherein the measurement circuitry is configured to perform the current-voltage measurements over at least the ESD-protection diode.

4. The apparatus according to claim 1, wherein, in performing the current-voltage measurements, the measurement circuitry is configured to apply two or more different current-voltage operating points to the digital signal pad.

5. The apparatus according to claim 1, wherein, in response to determining the test success, the measurement circuitry is configured to apply an additional test to the electronic device.

6. The apparatus according to claim 1, wherein the circuit path comprises an Electro-Static Discharge (ESD) protection diode of the electronic device, and wherein the measurement circuitry is configured to distinguish between test failure due to a fault in the circuit path and test failure due to poor contact quality, by comparing the electrical resistance of the circuit path to a threshold derived from an expected resistance of the ESD protection diode.

7. A method for automatic testing of an electronic device, the method comprising:
   selecting a single circuit path in the electronic device that passes via a digital signal pad of the electronic device, which is configured to carry a digital signal;
   estimating a single non-binary measure indicative of an electrical resistance of the single circuit path, by performing current-voltage measurements; and
   distinguishing, based solely on the electrical resistance of the single circuit path indicated by the single non-binary measure, between (i) test success, (ii) test failure due to a fault in the single circuit path, and (iii) test failure due to poor contact quality between the digital signal pad and the pad interface unit.

8. The method according to claim 7, wherein the circuit path runs between the digital signal pad and a power-supply pad of the electronic device.

9. The method according to claim 7, wherein the circuit path comprises an Electro-Static Discharge (ESD) protection diode of the electronic device, and wherein estimating the non-binary measure comprises performing the current-voltage measurements over at least the ESD-protection diode.

10. The method according to claim 7, wherein performing the current-voltage measurements comprises applying two or more different current-voltage operating points to the digital signal pad.

11. The method according to claim 7, and comprising applying an additional test to the electronic device, in response to determining the test success.

12. The Method according to claim 7, wherein the circuit path comprises an Electro-Static Discharge (ESD) protection diode of the electronic device, and wherein distinguishing between (i) test failure due to a fault in the circuit path, and (ii) test failure due to poor contact quality, comprises comparing the electrical resistance of the circuit path to a threshold derived from an expected resistance of the ESD protection diode.

* * * * *